United States Patent [19]

Hieronymi et al.

[11] Patent Number: 5,391,281
[45] Date of Patent: Feb. 21, 1995

[54] PLASMA SHAPING PLUG FOR CONTROL OF SPUTTER ETCHING

[75] Inventors: Robert Hieronymi, Rock Tavern, N.Y.; Steven Hurwitt, Park Ridge, N.J.

[73] Assignee: Materials Research Corp., Orangeburg, N.Y.

[21] Appl. No.: 45,368

[22] Filed: Apr. 9, 1993

[51] Int. Cl.⁶ .............................................. C23C 14/00
[52] U.S. Cl. ........................ 204/298.37; 204/298.34; 204/298.31; 204/192.32
[58] Field of Search ...................... 204/298.01, 298.31, 204/298.33, 298.34, 298.37, 192.1, 192.12, 192.3, 192.32, 192.35, 192.36, 192.37; 156/345, 646

[56] References Cited

U.S. PATENT DOCUMENTS

| | | | |
|---|---|---|---|
| 1,624,071 | 4/1927 | Richardson | 204/192.1 |
| 2,103,623 | 12/1937 | Kott | 204/192.12 |
| 2,257,411 | 9/1941 | Berghaus et al. | 204/192.12 |
| 2,305,758 | 12/1942 | Berghaus et al. | 204/192.12 |
| 2,346,483 | 4/1944 | Goss | 324/156 |
| 2,463,180 | 3/1949 | Johnson | 204/298.04 |
| 2,843,542 | 7/1958 | Callahan | 204/192.16 |
| 3,100,272 | 8/1963 | Wehner | 204/298.31 |
| 3,233,137 | 2/1966 | Anderson et al. | 204/192.12 |
| 3,329,601 | 7/1967 | Mattox | 204/298.05 |
| 3,394,066 | 7/1968 | Miles | 204/192.12 |
| 3,458,426 | 7/1969 | Rausch et al. | 204/298.06 |
| 3,619,402 | 11/1971 | Wurm et al. | 204/298.12 |
| 3,875,028 | 4/1975 | Altee et al. | 204/192.11 |
| 4,116,793 | 9/1978 | Penfold et al. | 204/192.12 |
| 4,132,612 | 1/1979 | Penfold et al. | 204/192.12 |
| 4,132,613 | 1/1979 | Penfold et al. | 204/192.12 |
| 4,342,901 | 8/1982 | Zajac | 204/298.31 |
| 4,578,559 | 3/1986 | Hijikata et al. | 156/345 |
| 4,624,767 | 11/1986 | Obinata | 204/298.37 |
| 4,632,719 | 12/1986 | Chow et al. | 204/298.37 |
| 4,844,775 | 7/1989 | Keeble | 156/643 |
| 4,946,576 | 8/1990 | Dietrich et al. | 204/298.06 |
| 4,963,242 | 10/1990 | Sato et al. | 204/298.37 |
| 5,009,738 | 4/1991 | Gruenwald et al. | 204/298.31 |

FOREIGN PATENT DOCUMENTS 0045858 2/1982 European Pat. Off. .
4325041A1 2/1994 Germany .
WO92/22920 12/1992 WIPO .

Primary Examiner—R. Bruce Breneman
Assistant Examiner—Rodney G. McDonald
Attorney, Agent, or Firm—Wood Herron & Evans

[57] ABSTRACT

A re-entrant plug structure is disclosed which extends inside a processing chamber containing an ionized plasma in proximity to the plasma to physically displace the ionized plasma and selectively controllably vary concentration of ionized gas particles over the surface of a wafer to be sputter etched which is supported inside the chamber. The variation of concentration of the ionized plasma allows the selectively controllable variation of sputter etch rates on the surface of the wafer. The re-entrant plug structure may be formed as part of the enclosure cover of the processing chamber or may be a separable moveable unit which is inserted into the plasma through an opening in the processing chamber. The re-entrant plug may be of various lengths, diameters and shapes to displace and shape the ionized plasma. In an alternative embodiment of the invention, the plug contains a permanent or electromagnet which further magnetically displaces and shapes the plasma in addition to the physical displacement caused by the re-entrant plug.

22 Claims, 2 Drawing Sheets

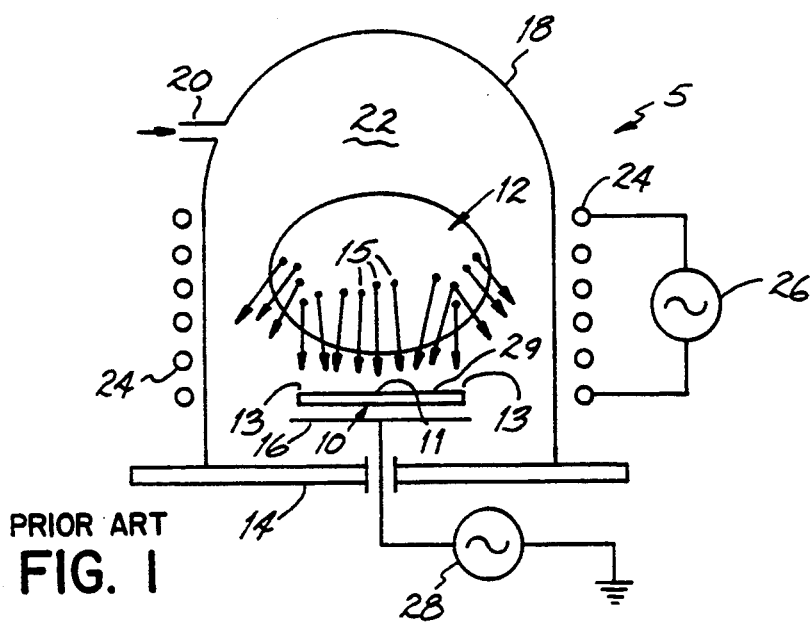
PRIOR ART
FIG. 1
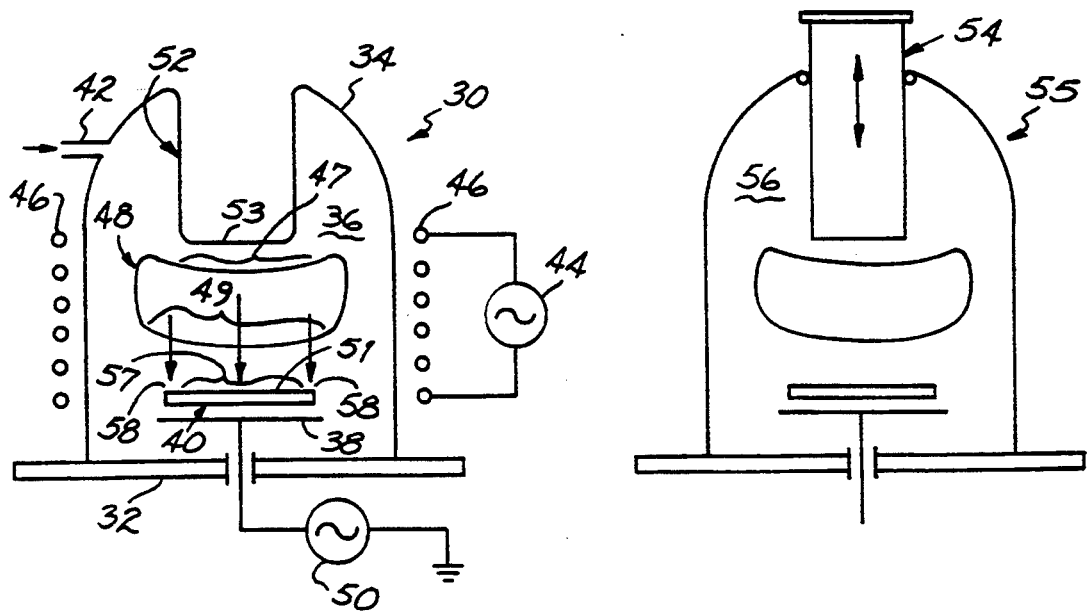
FIG. 2A
FIG. 2B

PLASMA SHAPING PLUG FOR CONTROL OF SPUTTER ETCHING

FIELD OF THE INVENTION

This patent relates generally to the sputter etching of a substrate surface using an ionized gas plasma, and specifically to controlling the ionized gas plasma to achieve a more uniform, or alternatively, a selectively variable etch across the surface of the substrate.

BACKGROUND OF THE INVENTION

In the processing of semiconductor workpieces or "wafers" into integrated circuits, sputter etching is a technique that is often used to remove a layer of unwanted material from the wafer surface. The process of sputter etching is generally known and utilizes ionized particles of a charged gas plasma to bombard the surface of a wafer and dislodge or "sputter" away other substrate particles from the surface of the wafer. In sputter etching, a gas is introduced into a processing chamber which is preferably vacuum sealed and which may be typically fabricated from quartz. The wafer to be etched is supported on an electrically charged base or electrode within the reaction chamber whereon the wafer develops an electrical charge or bias. A work gas is introduced into the vacuum chamber opposite the surface of the charged wafer, and energy is inductively coupled to the gas through the processing chamber wall, such as by using an induction coil which surrounds the quartz processing chamber. The energy from the induced electric field ionizes the gas particles so that they acquire a net charge that is of the opposite polarity to the charge of the wafer support and the wafer. The ionized particles of the gas collectively form what is referred to as a gas plasma or plasma cloud. Since the ionized particles of the plasma and the wafer are of opposite polarities, the ionized particles in the plasma are attracted to the wafer surface, bombarding the surface of the wafer and dislodging material particles from the workpiece to, consequently, "etch" the wafer surface.

The sputter etching process commonly takes place at wafer voltages in the range of approximately 1,000 volts (1 kV). However, this relatively high voltage range is inappropriate for today's state-of-the-art microelectronic devices which are more susceptible to surface damage at these wafer charging voltages. As a result, lower wafer voltages, below 500 volts, are more desirable. Plasma etching that is accomplished using these lower wafer voltages is referred to as a "soft" plasma etch.

In a sputter etching process which utilizes an inductively coupled plasma as described above, the ionized plasma cloud that is formed in the proximity of the wafer often has an ion particle concentration or a "flux" concentration which is not perfectly uniform across the surface of the wafer. That is, the ionized plasma cloud may be more concentrated over one area of the wafer than over another area of the wafer. As a result of the nonuniformity of the plasma flux concentration, the etch rate on the surface of the wafer is generally nonuniform. For example, if the flux concentration is greater at the center of the cloud, the center of the wafer is etched at a higher rate than the peripheral edges. Nonuniformity in the flux concentration of the plasma may be due to various conditions, such as the relative concentration of the gas used to make the plasma cloud, the shape of the plasma, the wall effects of the processing chamber and any external electric or magnetic field effects around the chamber, as well as the effects of the electric field which ionizes the gas to create the plasma cloud within the chamber.

Therefore, it is an objective of the present invention to provide a more uniform etch rate across the surface of a wafer substrate, and thereby provide a more nearly uniform etch depth across the wafer from the center to the peripheral edge thereof. It is further an objective of the present invention to provide a selectively variable etch rate across the surface of the wafer to tailor the etch depth across the wafer.

SUMMARY OF THE INVENTION

The present invention selectively varies the etch rate across a wafer surface by shaping the ionized plasma cloud within the processing chamber so that the flux or ion concentration of the plasma is selectively increased or decreased across the wafer surface. By shaping the plasma to provide a more uniform concentration of ions across the wafer, the uniformity of the etch is improved. The plasma cloud is shaped in the present invention by physically displacing the cloud in a predetermined way with a plug to move portions of the plasma cloud away from certain areas of the wafer and closer to other areas of the wafer. To physically displace and shape the plasma cloud, the present invention utilizes a reentrant plug structure which extends inside of the processing chamber, and proximate to but directly opposite the substrate wafer surface which is to be etched. The re-entrant plug extends into the plasma cloud above the wafer and displaces the plasma cloud outwardly from the center of the wafer surface to provide an increased ion concentration at the peripheral edges of the wafer and a decreased ion concentration at the center region. In this way, the re-entrant plug modifies the etching rates in some sections of the wafer surface relative to the etching rates in other sections of the wafer surface, thereby providing a more uniform etch rate across the wafer surface.

In one embodiment of the present invention, the re-entrant plug is generally cylindrical to follow the cylindrical shape of a typical processing chamber, and it extends symmetrically into the center of the plasma cloud to displace the plasma cloud proximate its center evenly in all directions. A symmetrical plug is used when the process chamber has a symmetrical shape, such as a cylindrical shape, and when the plasma cloud has a generally symmetrical shape within the chamber. In other embodiments of the present invention, the reentrant plug is non-symmetrical and extends into the plasma cloud elsewhere than into its center. The exact shaping of the plasma cloud using the re-entrant plug of the present invention may be varied by varying the diameter, length, and/or shape of the plug or by varying the location of the insertion of the plug into the plasma cloud with respect to the shape of the cloud and the location of the wafer being etched. The re-entrant plug structure of the present invention may be integrally formed with a portion of the processing chamber cover, such as being formed at the top of a quartz cover which is used in a typical process chamber. For such an embodiment, the depth of penetration of the plug into the chamber and into the plasma cloud is essentially fixed for a particular chamber cover. Alternatively, the re-entrant plug structure of the present invention may be a separate, variably positionable member which may be located inside of the processing chamber at varying insertion depths.

In an alternative embodiment of the present invention, a magnet is placed within the re-entrant plug. The magnetic field associated with such a magnetic plug further shapes and confines the ionized particles of the plasma cloud, in addition to any shaping which is achieved due to the displacement effects of the re-entrant plug. In this way, the magnetic field further displaces and shapes the plasma and varies the etching rates across the surface of the wafer to consequently improve the etch uniformity across the wafer surface. The shape and size of the magnet, the strength of its magnetic field and its orientation within the re-entrant plug may be varied in the present invention in order to achieve a specific plasma shape and a more uniform etch across the wafer surface. Additionally, the magnet structure within the re-entrant plug may be a permanent magnet with predetermined magnetic field strength or a variable electromagnet wherein the magnetic field strength may be externally increased or decreased.

Other objects and advantages of the present invention will become apparent from the following detailed description when read in connection with the accompanying drawings.

BRIEF DESCRIPTION OF THE DRAWINGS

FIG. 1 is a front elevational view of a prior art plasma etch processing chamber used for etching a substrate surface with an ionized gas plasma cloud;

FIG. 2A is a front elevational view of a plasma etch process chamber using the re-entrant plug of the present invention to displace the ionized gas plasma cloud;

FIG. 2B is a front elevational view of a plasma etch process chamber using an alternative embodiment of the re-entrant plug of the present invention;

DETAILED DESCRIPTION OF THE INVENTION

Figure 3A:
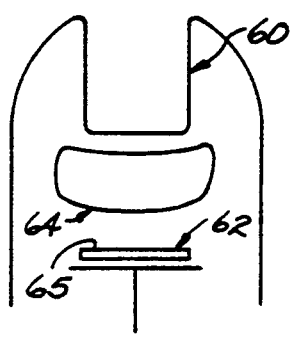
FIG. 3A is a front elevational view of an alternative embodiment of the re-entrant plug of the present invention.

Referring to FIG. 1, a prior art plasma sputter etch processing chamber 5 is shown for sputter etching a substrate or semiconductor wafer 10 using an ionized gas plasma cloud 12. Processing chamber 5 has a base 14 which includes a wafer support 16 to hold wafer 10 inside the chamber 5 while it is being etched. Wafer 10 sits upon support 16 and is enclosed within chamber 5 by a dielectric cover 18, which is vacuum sealed to the base 14 to create a processing space 22 within processing chamber 5 which is suitable for plasma etching wafer 10. An etching gas such as argon is introduced into chamber 5 through gas inlet 20, and the wafer 10 is positioned on support 16 within chamber 5 such that the etching gas introduced into the processing space 22 via gas inlet 20 is concentrated substantially above the top surface 29 of wafer 10.

The dielectric chamber cover 18 is typically made of quartz, and electrical energy is inductively coupled to the gas contained within processing space 22 through an induction coil 24 which surrounds cover 18 of the process chamber 5. The coil 24 is supplied by an intermediate frequency power source 26, which typically operates at a frequency around 450 KHz. Electrical energy from coil 24 is inductively coupled to the etching gas so as to ionize the gas and create an ionized gas plasma cloud 12 which is made up of ionized particles 15 and free electrons 15. Plasma cloud 12 is confined substantially above the wafer support 16 and wafer 10.

To perform the etching process on wafer 10, the wafer 10 is electrically charged or biased through its contact with wafer support 16 which is electrically coupled to a high frequency electrical energy source 28 operating typically at a frequency around 13.5 MHz. The wafer 10 is charged by source 28 and support 16 to have an electrical charge that is of an opposite polarity to the ionized particles 15 in the plasma cloud 12. Normally, the ionized plasma includes positively charged particles and free electrons. Therefore, the wafer will typically be negatively biased, and an electrical field is established between the plasma 12 and the wafer 10. The positively ionized particles 15 from the cloud 12 are attracted downwardly to the upper surface 29 of wafer 10 under the influence of the electric field, whereat they bombard the top surface 29 of the wafer 10 with sufficient energy to remove or "sputter" away a layer of the upper wafer surface 29. Sputter etching processes in the past have commonly taken place using wafer-charging voltages from source 28 of approximately 1,000 volts (1 kV). However, today's state-of-the-art wafers and microelectronic devices are susceptible to damage at such high charging voltages due to the ions being too energetic when they strike the wafer. Alternatively, the etching is done at wafer charging voltages around 500 volts. Such a low-voltage process is typically referred to as a "soft" sputter etch. The apparatus used for sputter etch processing may vary. That is, the shape of the chamber 5, the electrical operation of the plasma charging device 24, and/or operation of the wafer support 16 may all be varied without departing from the scope of this invention, as various plasma etching chambers are commercially available. For example, the apparatus shown in FIG. 1 ionizes the gas using inductively coupled energy; however, the electrical circuitry or method which is used to ionize the etching gas into a plasma cloud may vary without departing from the scope of the present invention.

Frequently, the ion concentration or "flux" concentration of ionized particles in plasma cloud 12 is not uniform across the surface 29 of wafer 10. In fact, the concentration of the plasma cloud 12 is rarely, if ever, perfectly uniform across the etching surface 29 because it is affected by many factors, including the relative gas concentration and shape of the plasma cloud, the shape of the chamber 5 and the wall effects of cover 18, and any external electric or magnetic field effects around chamber 5, as well as the effects of the inductive electric field which ionizes the gas within the chamber 5 into a plasma 12. When the plasma flux concentration is nonuniform across the surface 29, the etch depth of wafer surface 29 by the plasma 12 is non-uniform. Generally, the flux concentration of the plasma 12 is greater at the center of the plasma cloud, and therefore, the etch rate and consequent depth of etch is greater at the center region 11 of the wafer 10 than around the peripheral edges 13 of wafer 10.

Referring now to FIG. 2A to illustrate the re-entrant plug of the present invention, the process chamber 30 comprises a base 32 and a cover 34 which form a vacuum processing space 36 for sputter etching a wafer 40. A support 38 is mounted to base 32 and underlies the wafer 40 which is to be sputter etched. An etching gas, which is to be ionized to create a plasma 48, is introduced through gas inlet 42. Power source 44 supplies power to an inductive coil 46 which is wound around cover 34. The coil 46 inductively couples energy to the gas to ionize the gas and create the plasma cloud 48 proximate to and generally above wafer 40 which is to be sputter etched. High frequency source 50 biases wafer support 38 to electrically charge wafer 40, which in turn promotes bombardment of the upper surface 51 of wafer 40 by the ionized particles of plasma cloud 48 to sputter etch the upper wafer surface.

To promote a more uniform etch rate across surface 51 of wafer 40, process chamber 30 utilizes a re-entrant plug 52 which extends generally downwardly into process space 36 towards the top surface 51 of wafer 40. Plug 52 may be a re-entrant plug structure which is immovable relative to cover 34 such as that shown in FIG. 2A or could be a variably positionable plug 54, such as the plug structure shown in FIG. 2B which can slide up and down in the top of chamber cover 55 to increase or decrease the depth of penetration of the plug 54 into the process space 56 of the process chamber 55. Referring to FIG. 1, with a greater concentration of ionized gas particles 15 above the center region 11 of wafer surface 29, the etch rate and the consequent depth of the etch into surface 29 is greater at the center than at the periphery 13 thereof. Furthermore, even assuming a uniform ion or flux concentration throughout plasma cloud 12, it may be appreciated, in reference to FIG. 1, that more ionized particles 15 from plasma cloud 12 strike the center region 11 of surface 29 than strike the marginal area proximate the peripheral edges 13 of surface 29 because more of a plasma cloud 12 is above the center 11 of wafer 10.

Referring to FIG. 2A, re-entrant plug 52 is integrally formed in the top of chamber cover 34 and is made of the same material as chamber cover 34, e.g., quartz. Plug 52 extends downwardly from the top of the chamber 30 into process space 36 and towards wafer 40 and support 38. The plug 52 extends opposite wafer 40 and into the plasma cloud 48 which generally overlies wafer 40 inside chamber 30. As shown in FIG. 1, the shape of the plasma cloud 12 in the process chamber 5, which does not include the plug 52 of the present invention, is generally spherical in shape. However, the shape and overall form of the plasma cloud 12, is variable and is affected by numerous factors as mentioned above, including, the shape of process space 36 and the wall effects of cover 34, the shape and dimensions of the wafer support 38 or other similar structures located within process space 36, the effect of the inductive electric and magnetic fields from coil 46, as well as any field effects around charged wafer support 38, and the relative particle concentration of the gas used to make plasma 48.

Re-entrant plug 52 extends into plasma cloud 48 from the top of chamber 30 and displaces plasma cloud 48 proximate the symmetrical center region 47 of the cloud 48. That is, the plug 52 moves the gas plasma 48 away from the center region 57 of the wafer 40 and towards the peripheral edge areas 58 of the wafer 40. In doing so, the plug 52 flattens out the bottom region 49 of the plasma cloud 48 that is closest to surface 51 that is to be sputter etched. In FIG. 2A, the bottom wall 53 of plug 52 is essentially flat and generally parallel to upper surface 51 of wafer 40. The plasma cloud 48, when plug 52 is inserted into process space 36, follows the flat contour of plug surface 53 and the concentration of the ionized plasma particles which overlies center region 57 of wafer surface 51 is decreased while the concentration of ionized plasma particles which overlies the surface areas adjacent the peripheral edges 58 of wafer 40 is increased. In effect, the plasma cloud 48 is flattened out in shape over the substantially planar upper surface 51 of wafer 40, and the plasma flux concentration is decreased over center region 57 of surface 51 and increased around the regions adjacent peripheral wafer edges 58. The variation of the plasma shape and ion concentration of the plasma cloud 48, in turn, increases the etch rate at surface areas adjacent the peripheral edges 58 while decreasing the etch at center region 57 of surface 51 which results in a more uniform sputter etch across the upper surface 51 of wafer 40.

Figure 3B:
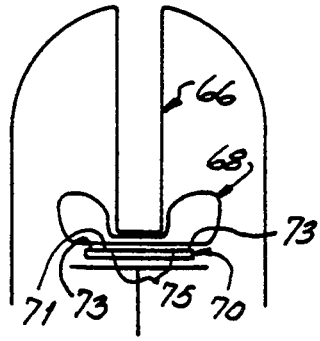
FIG. 3B is a front elevational view of another alternative embodiment of the re-entrant plug of the present invention.

The shape of re-entrant plug 52, as well as its penetration depth into plasma cloud 48 determines the effectiveness that plug 52 has in displacing the plasma within chamber 30 and promoting a more uniform etch rate across wafer 40. Therefore, plug 52 may be adapted to achieve the desired plasma ion concentration, plasma cloud thickness and shape, and resultant etching rate uniformity across surface 51 of wafer 40 by changing the diameter, length, and shape of plug 52, as well as by varying the location of the plug 52 with respect to wafer 40. Pursuant to this, the effective end 53 of plug 52, which is proximate wafer 40 and surface 51, may have various shapes, e.g., end 53 may be flat, rounded or pointed. For example, FIG. 3A shows a re-entrant plug 60 which has a diameter approximately equal to the diameter of wafer 62 that is being etched. Consequently, the plasma cloud 64 is flattened along approximately its entire width, and therefore, the ion concentration of plasma 64 is generally uniform across the upper surface 65 of wafer 62. This, in turn, promotes a more uniform etch rate across surface 65 of the wafer. In another embodiment of the present invention shown in FIG. 3B, a re-entrant plug 66 is longer than the plugs 52 and 60 previously shown and plug 66 has a smaller diameter than plugs 52 and 60. As a result, plug 66 extends further into plasma cloud 68 and closer to the upper surface 71 of wafer 70. In the configuration of FIG. 3B, then, the plasma 68 is not uniformly flattened or shaped across the entire upper surface 71 of the wafer 70, and therefore, plug 66 does not promote a uniform ion concentration across the surface of the wafer 70. Rather, a greater volume of the plasma cloud 68 is displaced towards the sides of the chamber, and the concentration of ionized plasma particles over the center region of wafer 70 is decreased. The plug of FIG. 3B, therefore, results in an increased etch rate on upper surface 71 at those surface areas proximate the peripheral edges 73 of the wafer and a decreased etch rate at the center region 75 of the wafer 70. Thus, as shown, the re-entrant plug of the present invention may be tailored in length, diameter, and proximity to the wafer to increase or decrease plasma concentration at certain areas of the wafer surface, according to a desired application, to achieve a more uniform or alternatively, a selectively variable, sputter etch rate across the entire wafer surface.

Figure 3C:
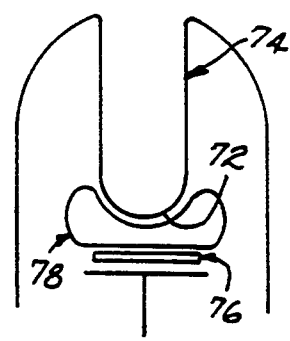
FIG. 3C is a front elevational view of another alternative embodiment of the re-entrant plug of the present invention.

Still, another embodiment, shown in FIG. 3C, is a re-entrant plug 74 which has a smoothly contoured convex, or rounded, end 72 proximate the wafer 76, for more smoothly shaping and displacing the plasma cloud 78 over wafer 76. This embodiment may be useful when it is desirable to vary the concentration of ionized plasma particles 78 more gradually from the center of wafer 76 to the outer periphery. It can be appreciated that the dimensions of the re-entrant plug of the present invention and the proximity of the plug to the wafer may be dictated by factors such as the shape of the sputter etching process chamber, the relative shape and concentration of the ionized gas plasma, the pressure conditions within the process chamber, the presence of other physical bodies (e.g., a wafer support) within the chamber, and the effect of the gas ionizing and wafer charging electric fields inside the process chamber. Therefore, various sizes and shapes of the plasma-shaping plugs of the present invention may be used without departing from the scope of this invention.

Figure 4A:
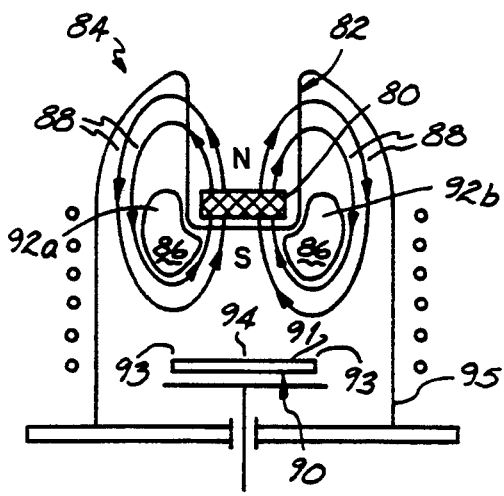
FIG. 4A is a front elevational view of another alternative embodiment of the present invention showing a magnet placed within the reentrant plug to further shape and confine an ionized plasma cloud in a processing chamber.

In FIG. 4A, another embodiment of the present invention comprises a process chamber 84 which utilizes a magnet 80 within the plasma shaping plug 82. The process chamber 84 of FIG. 4A works similarly to the process chamber 30 shown in FIG. 2A; however, the magnet 80 within the plug 82 also influences the shape and relative concentration of the ionized plasma cloud 86 in addition to any physical displacement or shaping of the plasma 86 caused by the re-entrant plug 82. The magnetic field lines 88 extend between the opposing North-South poles of the magnet 80, and the field lines 88 magnetically shape the ionized particles of the plasma cloud 86 of chamber 84.

Figure 4B:
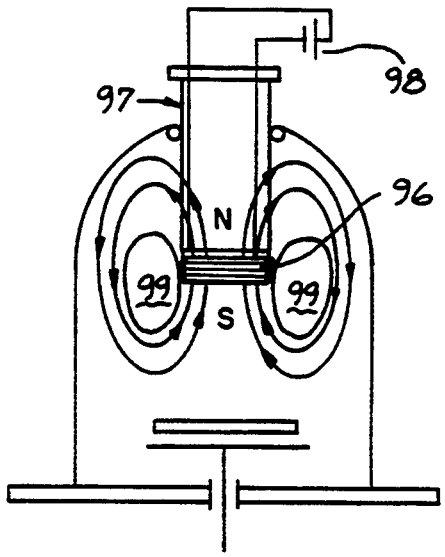
FIG. 4B is a front elevational view of another alternative embodiment of the present invention.

When the magnet 80 is oriented in the plug 82 such that the North pole of the magnet faces towards the top of the chamber 84 and the South pole faces the upper surface 91 of wafer 90, the conventional magnetic field lines 88 orient themselves as shown in FIG. 4A. The magnetic field lines 88 confine the electrically ionized particles of the gas plasma 86 so that the plasma cloud 86 is focused in regions 92a and 92b around the peripheral edge 93 of wafer 90. As may be seen in reference to FIG. 4A, the plasma cloud 86 confined in this way will generally take a shape that resembles a donut, where there are little or no ionized gas particles left suspended over the center region 94 of wafer surface 91. The sputter etch rate is then decreased at the center region 94 and increased proximate the peripheral edge 93 of the wafer. In this way, magnetic field 88 which is used to concentrate the plasma 86 in the peripheral region, shapes the plasma in addition to the shaping effects of the re-entrant plug 82. The size of magnet 80, its magnetic field strength, and its orientation within the re-entrant plug 82 may all be varied, as required, to promote a more uniform sputter etch rate across the surface of wafer 90 or to tailor the etch rate across wafer 90 to yield a desired pattern or profile. While FIG. 4A shows magnet 80 placed within a re-entrant plug 82 which is formed within chamber cover 95, a magnet 96 may also be placed inside a selectively positionably plug structure such as plug 97 shown in FIG. 4B. Additionally, while FIG. 4A shows a permanent magnet, an electromagnet 96 powered by electrical source 98 may also be utilized in the present invention. With a movable plug 97, the depth of penetration into the plasma 99 and the resultant shaping of the plasma 99 is variable. Similarly, the strength of electromagnet 96 may be varied by increasing or decreasing the magnitude of the electrical current supplied to magnet 96 by source 98.

While the present invention has been illustrated by description of several preferred embodiments and while the preferred embodiments have been described in detail, it is not the intention of the applicants to restrict or in any way limit the scope of the appended claims to such detail. Additional advantages and modifications will readily appear to those skilled in the art. For example, while the invention has been described using inductively coupled energy to ionize the gas by means of a conductor coil surrounding the processing chamber, other methods of ionization, accompanied by various other types of etching gases and various gas inlet structures, may be used without departing from the scope of the present invention. Moreover, the plug structure of the present invention may assume various shapes, dimensions, and penetration depths into the process chamber to accomplish the plasma shaping desired without departing from the scope of the present invention. Furthermore, different types of magnetic structures other than the magnets shown in FIGS. 4A and 4B may be used to magnetically shape and confine the plasma. The invention in its broader aspects is, therefore, not limited to the specific details, representative apparatus and method, and illustrative examples shown and described. Accordingly, departures may be made from such details without departing from the spirit or scope of applicant's general inventive concept.

We claim:

1. A process chamber for sputter etching the surface of a wafer with an ionized plasma, the chamber comprising:
   a base;
   a cover surrounding the base to create an enclosure for containing an ionized plasma in proximity to a wafer to be sputter etched;
   a support within said enclosure for supporting a wafer to be etched;
   an electrical source for electrically biasing said wafer;
   an element coupled to the chamber for introducing an ionizable gas into said enclosure;
   an ionizing source for ionizing the gas to provide a plasma containing ionized gas particles, said ionized particles having an electrical charge opposite in polarity to said biased wafer so that the ionized particles are attracted away from the plasma toward said wafer to bombard the surface of said wafer and sputter etch the wafer surface; and
   a non-conductive plug having at least one dimension and extending inside said enclosure into said ionized plasma, the plug dimension selected such that the plug selectively physically displaces said plasma and selectively varies the ion concentration relative to said wafer surface to thereby provide a selectively variable sputter etch rate across the wafer surface.

2. The process of claim 1 wherein the plug is integrally formed with said cover means.

3. The process chamber of claim 1 wherein the plug is a separable, movable unit which is inserted through an opening in said cover to selectively variable penetration depths into the enclosure to vary length dimension of the plug within the enclosure.

4. The process chamber of claim 1, wherein the plug is located inside said enclosure generally opposite the wafer surface to be etched.

5. The process chamber of claim 1, wherein the plug includes an inner face which is positioned generally opposite the wafer surface.

6. The process chamber of claim 5, wherein the inner face opposite the wafer surface is substantially planar.

7. The process chamber of claim 6, wherein the inner plug face extends generally parallel to the wafer surface.

8. The process chamber of claim 5, wherein the inner face opposite the wafer surface is substantially convex.

9. The process chamber of claim 1 further comprising a magnetic device positioned inside the non-conductive plug to provide a magnetic field in the proximity of the ionized plasma to selectively physically and magnetically displace and shape the plasma in the proximity of the wafer surface and further selectively vary the sputter etch rate across the wafer surface.

10. The process chamber of claim 9, wherein the magnetic device is an electromagnet.

11. The process chamber of claim 10 further comprising a selectively variable electrical supply connected to the electromagnet to selectively control the strength of the field of the magnet and further selectively displace and shape the plasma.

12. A method of achieving a selectively variable sputter etch rate of a wafer surface using an ionized gas plasma in a process chamber comprising the steps of:
introducing an ionizable gas into a process chamber comprising a base, a cover and containing an electrically biased wafer;
coupling electrical energy to the gas to create an ionized plasma of charged particles having an electrical charge opposite in polarity to the biased wafer, so that the charged particles bombard the wafer surface and sputter etch the wafer surface; and
positioning a non-conductive plug having at least one selected dimension inside the process chamber proximate the ionized plasma to selectively physically displace the plasma and selectively vary the ion concentration relative to the wafer surface and thereby provide a selectively variable sputter etch rate across the wafer surface.

13. The method of claim 12 wherein the plug is integrally formed with said cover.

14. The method of claim 12 wherein the plug is a separable, movable unit which is inserted through an opening in said cover, the method further comprising inserting the plug to selected variable penetration depths in the enclosure to vary a length dimension of the plug within the enclosure.

15. The method of claim 12 further comprising positioning said plug in said process chamber generally opposite said wafer surface to be etched.

16. The method of claim 12, wherein the plug includes an inner face, the method further comprising the step of positioning the inner face generally opposite the wafer surface.

17. The method of claim 16, wherein the inner face opposite the wafer surface is substantially planar.

18. The method of claim 17, wherein the inner plug face extends generally parallel to the wafer surface.

19. The method of claim 16, wherein the inner face opposite the wafer surface is substantially convex.

20. The method of claim 12 further comprising the step of
placing a magnetic device inside the non-conductive plug to provide a magnetic field in the proximity of the ionized plasma to selectively physically and magnetically displace and shape the plasma in the proximity of the wafer surface and further selectively vary the sputter etch rate across the wafer surface.

21. The method of claim 20, wherein the magnetic device is an electromagnet.

22. The method of claim 21 further comprising the step of
coupling a selectively variable electrical supply to the electromagnet to selectively control the strength of the field of the magnet and further selectively displace and shape the plasma.

* * * * *

UNITED STATES PATENT AND TRADEMARK OFFICE
CERTIFICATE OF CORRECTION

PATENT NO. : 5,391,281
DATED : February 21, 1995
INVENTOR(S) : Hieronymi et al.

It is certified that error appears in the above-indentified patent and that said Letters Patent is hereby corrected as shown below:

Col. 8, line 62 (claim 2), after "process" insert --chamber--.

Col. 10, line 21 (claim 18), after "inner" delete --plug--.

Signed and Sealed this

Twelfth Day of September, 1995

Attest:

BRUCE LEHMAN

*Attesting Officer*   *Commissioner of Patents and Trademarks*